United States Patent
Mostow

(10) Patent No.: US 9,057,764 B2
(45) Date of Patent: Jun. 16, 2015

(54) DETECTION OF UNCHECKED SIGNALS IN CIRCUIT DESIGN VERIFICATION

(75) Inventor: Mark A. Mostow, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 13/283,305

(22) Filed: Oct. 27, 2011

(65) Prior Publication Data

US 2013/0110487 A1     May 2, 2013

(51) Int. Cl.
*G06F 17/50*     (2006.01)
*G01R 31/3183*     (2006.01)

(52) U.S. Cl.
CPC ........ *G01R 31/318357* (2013.01); *G06F 17/50* (2013.01); *G06F 17/5081* (2013.01); *G06F 17/5045* (2013.01)

(58) Field of Classification Search
CPC . G06F 17/50; G06F 17/5045; G06F 17/5081; G01R 31/318357
USPC ................. 716/106, 111, 115, 132, 136, 139; 703/14
See application file for complete search history.

(56) References Cited

U.S. PATENT DOCUMENTS

| | | | | |
|---|---|---|---|---|
| 5,414,716 | A * | 5/1995 | Bershteyn ..................... | 714/738 |
| 5,568,407 | A * | 10/1996 | Hass et al. ..................... | 702/118 |
| 6,131,181 | A * | 10/2000 | Bushnell et al. .............. | 716/108 |
| 6,212,667 | B1 * | 4/2001 | Geer et al. ..................... | 716/136 |
| 6,615,389 | B1 * | 9/2003 | Ohta et al. ..................... | 716/106 |
| 6,868,532 | B2 * | 3/2005 | Nadeau-Dostie et al. .... | 714/724 |
| 6,918,099 | B2 * | 7/2005 | Subbarayan ................... | 716/106 |
| 6,975,978 | B1 * | 12/2005 | Ishida et al. ................... | 703/15 |
| 7,058,909 | B2 * | 6/2006 | Lu et al. ......................... | 716/113 |
| 7,162,389 | B2 * | 1/2007 | Uozumi et al. ................ | 702/182 |
| 7,231,621 | B1 * | 6/2007 | Herron et al. ................. | 716/108 |
| 7,237,210 | B2 * | 6/2007 | Likovich et al. .............. | 716/104 |
| 7,278,056 | B2 * | 10/2007 | Hekmatpour .................. | 714/37 |
| 7,302,656 | B2 * | 11/2007 | Weber et al. .................. | 716/103 |
| 7,308,663 | B2 * | 12/2007 | Craig et al. ................... | 716/106 |
| 7,315,973 | B1 | 1/2008 | Wise | |
| 7,353,438 | B2 * | 4/2008 | Leung et al. .................. | 714/720 |

(Continued)

FOREIGN PATENT DOCUMENTS

EP     0453394 A2     10/1991
WO     9908212 A1     2/1999

OTHER PUBLICATIONS

Inno-Logic., "SystemVerilog Based Verification Methodology," ASIC/FPGA/Embedded—Design & Verification Expert, 2008. http://www.inno-logic.com/resourcesVMM.html.

(Continued)

*Primary Examiner* — Helen Rossoshek
(74) *Attorney, Agent, or Firm* — INTI International IP Law Group PLLC

(57) ABSTRACT

An unchecked signal detection mechanism runs simulation tests of circuit designs that normally pass. Before a simulation test is run, noise is injected into one randomly chosen signal. A random constant value is assigned to the randomly chosen signal. The constant random value is forced on the selected signal for the duration of the simulation test. Signals for which simulation tests always pass, even when their value is forced, are likely not checked and declared as suspect. The subset of suspect signals is then checked to determine whether their checkers are indeed missing or defective. Any verification flaws (holes) found are then fixed.

22 Claims, 4 Drawing Sheets

(56) References Cited

U.S. PATENT DOCUMENTS

| | | | |
|---|---|---|---|
| 7,356,786 B2* | 4/2008 | Schubert et al. | 716/106 |
| 7,383,519 B2* | 6/2008 | Iwamura | 716/106 |
| 7,444,600 B2* | 10/2008 | Kameyama et al. | 716/115 |
| 7,454,325 B2* | 11/2008 | Behm et al. | 703/17 |
| 7,509,600 B2* | 3/2009 | Rajski et al. | 716/136 |
| 7,516,430 B2* | 4/2009 | Chadha | 716/106 |
| 7,594,206 B2* | 9/2009 | Yoshida et al. | 716/136 |
| 7,689,941 B1* | 3/2010 | Ooi et al. | 716/133 |
| 7,797,601 B2* | 9/2010 | Kapur et al. | 714/726 |
| 7,823,103 B2* | 10/2010 | Pokorny | 716/51 |
| 7,895,555 B1* | 2/2011 | West et al. | 716/108 |
| 7,984,403 B2* | 7/2011 | Oishi et al. | 716/106 |
| 7,987,442 B2* | 7/2011 | Rajski et al. | 716/136 |
| 8,099,271 B2* | 1/2012 | Schubert et al. | 703/17 |
| 8,122,423 B2* | 2/2012 | Zjajo et al. | 716/136 |
| 8,136,082 B2* | 3/2012 | Desineni et al. | 716/136 |
| 8,201,131 B2* | 6/2012 | Rajski et al. | 716/136 |
| 8,271,256 B2* | 9/2012 | Khalily et al. | 703/14 |
| 8,341,570 B2* | 12/2012 | Jain et al. | 716/106 |
| 8,413,088 B1* | 4/2013 | Armbruster et al. | 716/106 |
| 8,490,046 B2* | 7/2013 | Bhinge | 716/136 |
| 2001/0010091 A1 | 7/2001 | Noy | |
| 2002/0072889 A1* | 6/2002 | Hoffman et al. | 703/14 |
| 2003/0125920 A1* | 7/2003 | Matsuoka et al. | 703/15 |
| 2006/0085713 A1 | 4/2006 | Takabatake | |
| 2007/0050740 A1* | 3/2007 | Jacobi et al. | 716/5 |
| 2007/0192753 A1 | 8/2007 | Lam et al. | |
| 2012/0198399 A1* | 8/2012 | Safarpour et al. | 716/106 |
| 2013/0019216 A1* | 1/2013 | Vasudevan et al. | 716/106 |

OTHER PUBLICATIONS

Fedeli et al., "Properties Incompleteness Evaluation by Functional Verification," IEEE Transactions on Computers, vol. 56, No. 4, pp. 528-544, Apr. 2007.

Pratish et al., "Automating Functional Coverage Convergence and Avoiding Coverage Triage with ECHO Technology," Synopsys, SNUG India Abstracts, Jun. 2010. http://www.synopsys.com/Community/SNUG/India/Pages/Abstracts.aspx?loc=India&locy=2010.

* cited by examiner

DETECTION OF UNCHECKED SIGNALS IN
CIRCUIT DESIGN VERIFICATION

FIELD OF THE INVENTION

The present invention relates to the field of verification, and more particularly relates to a method of detecting signals in a circuit design that are not checked in a verification environment.

SUMMARY OF THE INVENTION

There is thus provided in accordance with the present invention, a method for use on a computer of detecting unchecked signals in simulation tests of a circuit design, said method comprising injecting noise into one randomly selected signal in each simulation test, determining a set of signals whose corresponding simulation tests always pass, and declaring said set of signals as suspect for a missing or defective checker.

There is also provided in accordance with the invention, a method for use on a computer of detecting unchecked signals in simulation tests of a circuit design, said method comprising injecting noise into one randomly selected signal in each simulation test, determining a set of signals whose corresponding simulation tests always pass, declaring said set of signals as suspect for a missing or defective checker, and checking whether checkers associated with said suspect signals are missing or defective.

There is further provided in accordance with the invention, a computer program product for detecting unchecked signals in simulation tests of a circuit design, the computer program product comprising a computer usable medium having computer usable code embodied therewith, the computer usable program code comprising computer usable code configured for injecting noise into one randomly selected signal in each simulation test, computer usable code configured for determining a set of signals whose corresponding simulation tests always pass, and computer usable code configured for declaring said set of signals as suspect for a missing or defective checker.

BRIEF DESCRIPTION OF THE DRAWINGS

The invention is herein described, by way of example only, with reference to the accompanying drawings, wherein.

DETAILED DESCRIPTION OF THE INVENTION

Figure 1:
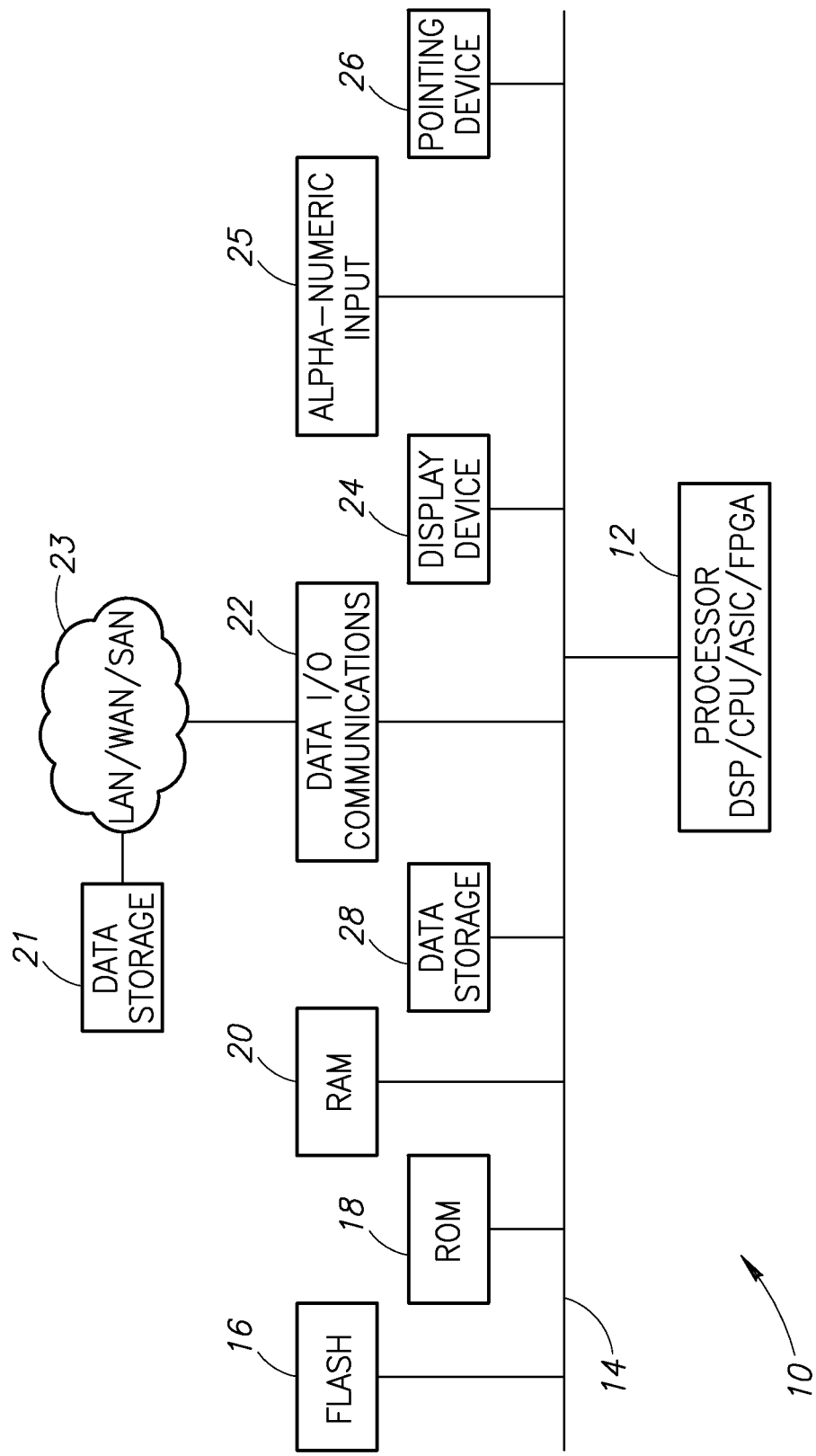
FIG. 1 is a block diagram illustrating an example computer processing system adapted to implement the unchecked signal detection mechanism of the present invention.

Conventional verification environments for testing the correctness of a circuit design by simulation typically include, among other verification components, checkers to verify that signals of the design behave as expected, relative to themselves and relative to other signals, when random tests are run on the simulated design.

These checkers report an error each time they detect that a signal deviates from its expected behavior. Numerous tests are run and each test passes unless one of the checkers reports an error. If checkers for some signals are missing or defective, however, it may happen that no errors will be reported for those signals. In this case, one of three scenarios is possible: (1) no checker function exists to check for circuit errors; (2) a checker function does exist to check for circuit errors but it is never called; and (3) a function does exist to check for circuit errors and is called, but flaws exist in the checker function.

Further, the failure or lack of checking of those signals may not be noticed, since it might be assumed that those signals always behave correctly in the circuit design. Such a resulting flaw or hole in the verification environment is significant since it can cause circuit design bugs to go unreported.

The present invention provides a mechanism to detect signals which are not checked in the verification environment. Use of the unchecked signal detection mechanism in a verification/simulation environment helps to close such verification flaws or holes.

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electro-magnetic, infrared, or semiconductor system, apparatus or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium is one that can contain or store the program for use by or in connection with the instruction execution system, apparatus, or device.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A block diagram illustrating an example computer processing system adapted to implement the system and methods of the present invention is shown in FIG. 1. The computer system, generally referenced 10, comprises a processor 12 which may comprise a digital signal processor (DSP), 7 central processing unit (CPU), microcontroller, microprocessor, microcomputer, ASIC or FPGA core. The system also comprises static read only memory 18 and dynamic main memory 20 all in communication with the processor. The processor is also in communication, via bus 14, with a number of peripheral devices that are also included in the computer system. Peripheral devices coupled to the bus include a display device 24 (e.g., monitor), alpha-numeric input device 25 (e.g., keyboard) and pointing device 26 (e.g., mouse, tablet, etc.)

The computer system is connected to one or more external networks such as a LAN or WAN 23 via communication lines connected to the system via data I/O communications interface 22 (e.g., network interface card or NIC). The network adapters 22 coupled to the system enable the data processing system to become coupled to other data processing systems or remote printers or storage devices through intervening private or public networks. Modems, cable modem and Ethernet cards are just a few of the currently available types of network adapters. The system also comprises magnetic or semiconductor based storage device 21 and/or 28 for storing application programs and data. The system comprises computer readable storage medium that may include any suitable memory means, including but not limited to, magnetic storage, optical storage, semiconductor volatile or non-volatile memory or any other memory storage device.

Software adapted to implement the system and methods of the present invention is adapted to reside on a computer readable medium, such as a magnetic disk within a disk drive unit. Alternatively, the computer readable medium may comprise a floppy disk, removable hard disk, Flash memory 16, EEROM based memory, bubble memory storage, ROM storage, distribution media, intermediate storage media, execution memory of a computer, and any other medium or device capable of storing for later reading by a computer a computer program implementing the method of this invention. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk or CD-ROM or may be downloaded over a network such as the Internet using FTP, HTTP, or other suitable protocols. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Unchecked Signal Detection

Figure 2:
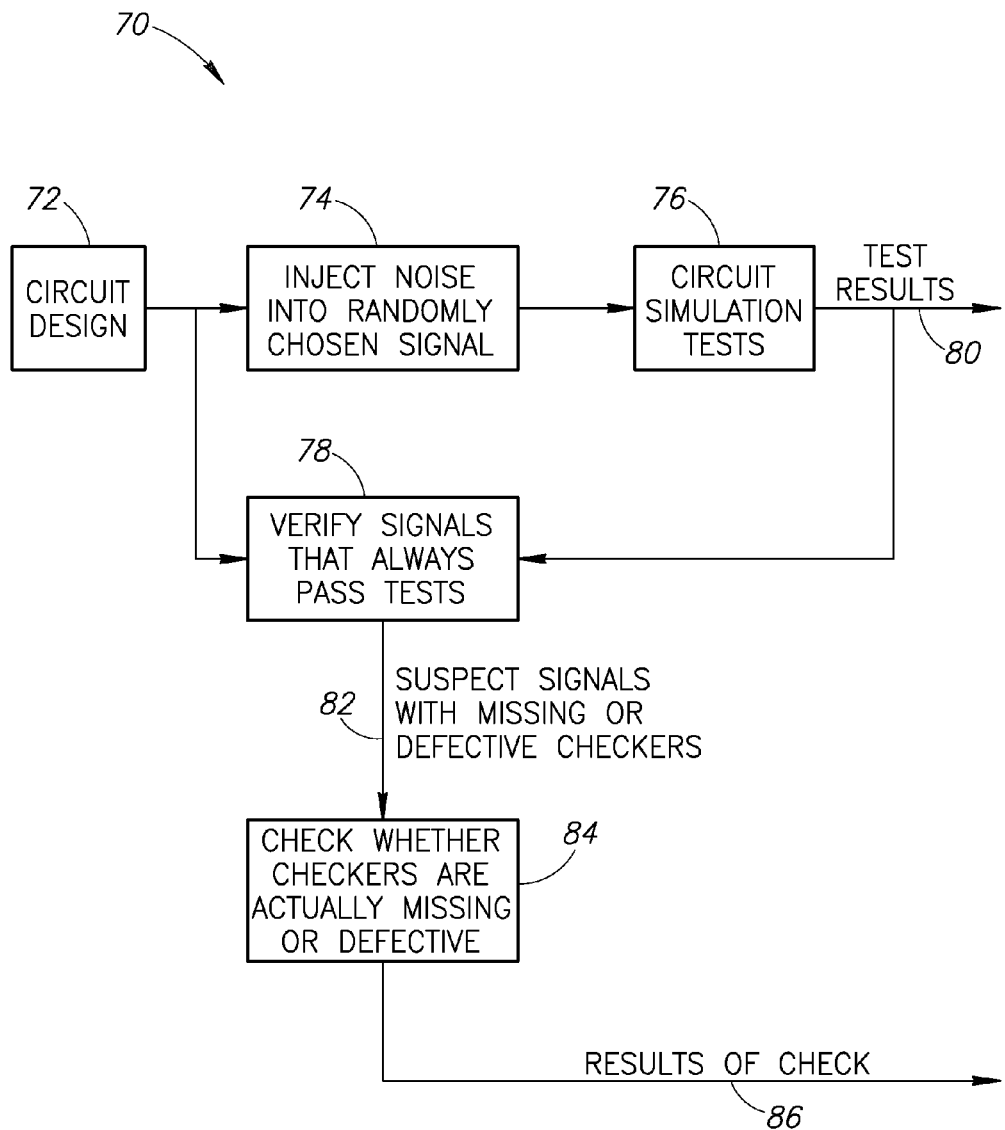
FIG. 2 is a general block diagram illustrating the unchecked signal detection mechanism of the present invention.

A general block diagram illustrating the unchecked signal detection mechanism of the present invention is shown in FIG. 2. The mechanism, generally referenced 70, comprises a circuit design 72, noise injection block 74, circuit simulation test block 76, signal verification block 78 and check block 84.

The unchecked signal detection mechanism runs simulation tests 76 of circuit designs 72 that normally pass. Before a simulation test is actually run, however, noise is injected (block 74) into one randomly chosen signal. The constant value assigned to the randomly chosen signal is also randomly determined. A constant random value is forced on the selected signal for the duration of the simulation test. Signals for which simulation tests always pass (block 78), even when their value is forced, are likely not checked and labeled as suspect 82. The subset of suspect signals (typically a small set) is then checked (automatically or manually) (block 84) to see if whether their checkers are indeed missing or defective, the results 86 of which are then reported.

Figure 3:
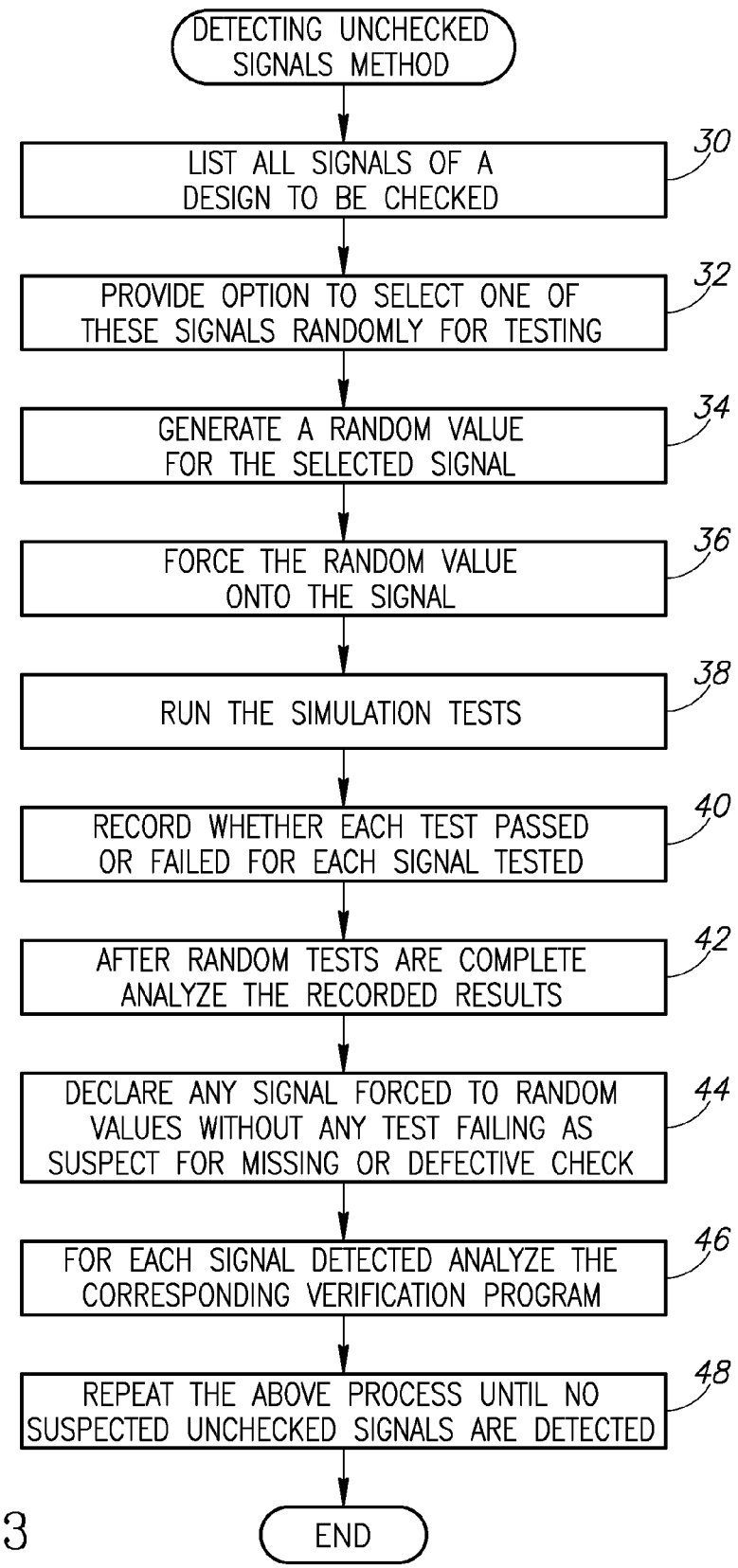
FIG. 3 is a flow diagram illustrating an example method of detecting unchecked signals.

A flow diagram illustrating an example method of detecting unchecked signals is shown in FIG. 3. First, all signals of the circuit design to be checked are listed in a file or other data entity (step 30). In the simulation and checking verification environment of the circuit design, an option to select one of these signals randomly, once per simulation test, is provided (step 32). Once a signal is randomly selected, a random value is chosen for it (step 34). The randomly chosen value is forced onto the selected signal (which is also randomly chosen) for the duration of the simulation test (step 36). It is noted that the ability to force a value onto a signal is a feature of conventional circuit simulators.

The collection of tests in simulation which are already in use in the verification environment of this particular circuit design are then run (step 38). Note that it is necessary to use only simulation tests which are known (from previous testing of this circuit design) to pass when the random forcing option of the unchecked signal detection mechanism of the present invention is not used.

For each simulation test run, a record of which signal had its value randomly forced and whether the test simulation passed or failed is recorded (step 40). After a large number of random tests have been run with the random forcing option enabled, the test results recorded in step 40 are analyzed (step 42). In one example embodiment, a script written for that purpose may be used to analyze the recorded results.

Any signal which has been forced to a random value at least a threshold number of times without any test failing is declared suspect for a missing or defective check (step 44). Note that the threshold value may be predetermined and/or configurable. In one example, the threshold is greater than or equal to five.

For each signal declared as suspect, the verification program is analyzed and studied (either automatically or manually) in order to find any missing or defective checkers (step 46). The above process (i.e. steps 32 through 46) is repeated until no additional suspected unchecked signals are detected (step 48).

Figure 4:
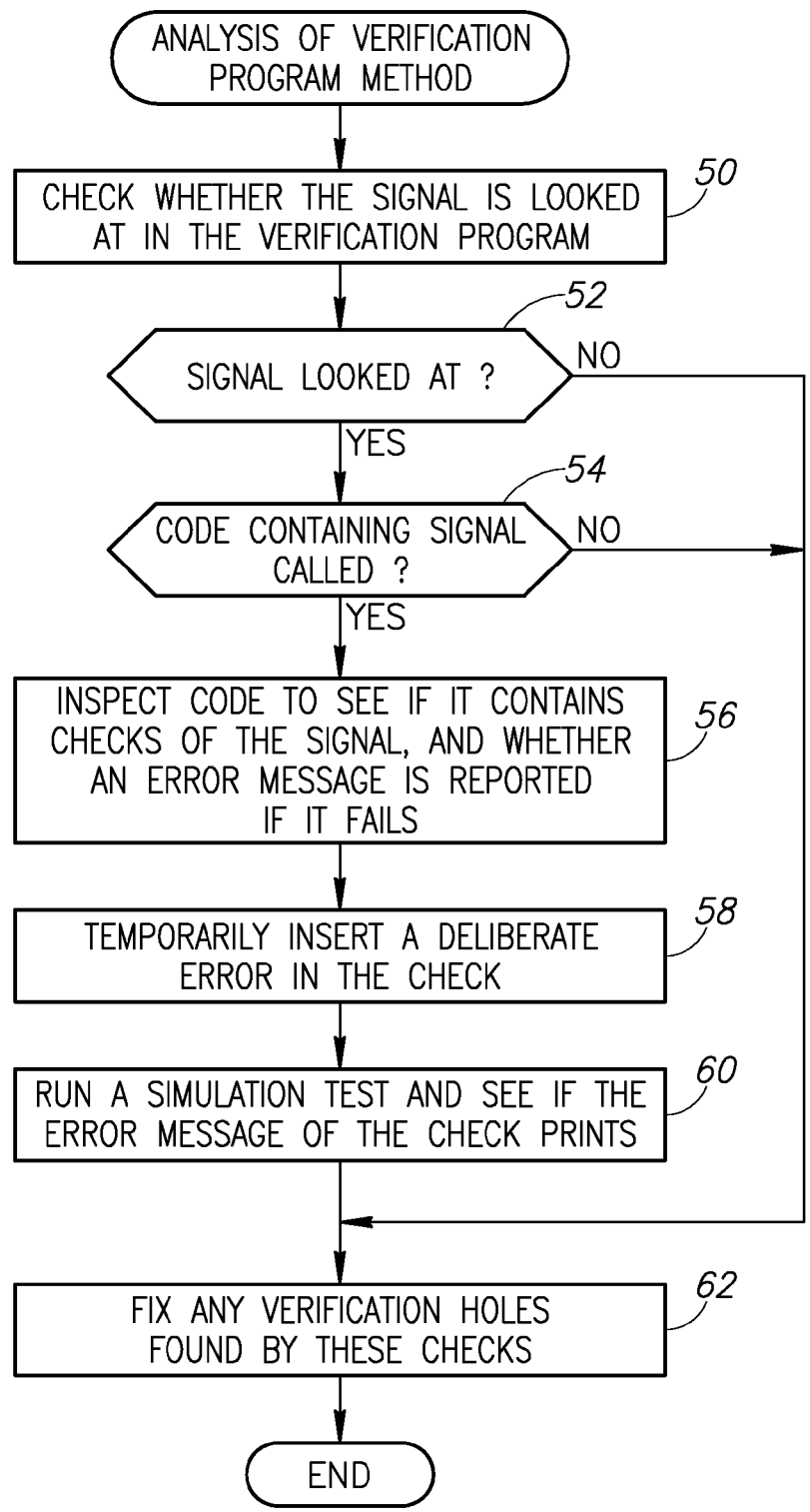
FIG. 4 is a flow diagram illustrating an example method of analyzing the verification program.

A flow diagram illustrating an example method of analyzing the verification program is shown in FIG. 4. The following method is performed automatically (via programmatical means) or manually (via human examination of code) for each signal declared as suspect to determine whether signal checking is really missing or defective.

First, it is examined whether the signal is looked at somewhere in the verification program (step 50). This can be achieved, for example, by searching the files of the program for the name of the signal. The file search can be performed using the well known Unix "grep" search command. Since a signal is commonly assigned a symbolic name within the program, one must first search the files for the signal name to find its symbolic name and then search again to see if and where the symbolic name is used.

If the program contains a code segment which looks at the signal (step 52), check if that code is ever called (step 54). This can be determined, for example, using well known code coverage techniques, or by inserting print statements in the code segment, running simulation tests and seeing if the inserted messages print. If code which looks at the signal is called (step 54), the code is inspected to see whether it contains checks of the signal and if these checks, when they fail, cause an error message to be reported (step 56). Note that as part of this debugging process, a deliberate error in the check in step 56 can temporarily be inserted (step 58). A simulation test is then run and then it is determined whether the error message of the check prints (step 60).

Any verification flaws (or holes) found in steps 50 through 60 described supra are then fixed (step 62). Note that the fix applied to the code may be performed programmatically or manually depending on the implementation of the mechanism.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A computer-implemented method of detecting signals that are not checked in a verification/simulation environment of a circuit design, said method comprising:
   randomly selecting a simulation test signal in a plurality of simulation tests;
   generating, on said computer, a constant random value;

forcing said simulation test signal to said constant random value for all simulation tests;

performing simulation tests with said simulation test signal;

after said simulation tests are complete, determining, on said computer, a set of simulation test signals whose corresponding simulation tests pass a number of times that exceeds a threshold, said determining comprising executing the plurality of simulation tests in the verification/simulation environment associated with said circuit design; and declaring, on said computer, one or more circuit verification checkers that correspond to said set of simulation test signals are suspect for being either missing or defective based on determining that the simulation tests that correspond to the set of simulation test signals pass the number of times that exceeds the threshold, the declared one or more circuit verification checkers indicating that the set of simulation test signals do not correspond to the one or more circuit verification checkers, that one or more of the circuit verification checkers is not called, or that one or more of the circuit verification checkers includes errors.

2. The method according to claim 1, further comprising checking whether checkers associated with said set of signals are missing or defective.

3. The method according to claim 1, wherein said forcing comprises forcing said constant random value on said randomly selected signal for the duration of said simulation tests.

4. The method according to claim 1, wherein said forcing comprises adding an option in a simulation and checking verification environment to randomly choose a signal in said circuit design once per simulation test.

5. The method according to claim 1, wherein determining comprises running only those simulation tests in use in a verification environment associated with said circuit design that are known to pass when random forcing is not employed.

6. The method according to claim 1, wherein determining comprises tracking which signal had its value randomly forced and whether said simulation test passed or failed.

7. The method according to claim 1, wherein determining comprises determining signals that have been forced to constant random values a threshold number of times without any simulation test failing.

8. The method according to claim 7, wherein said threshold is greater than or equal to five.

9. A computer-implemented method of detecting signals that are not checked in a verification/simulation environment of a circuit design, said method comprising:

randomly selecting a simulation test signal in a plurality of simulation tests;

generating, on said computer, a constant random value;

forcing said simulation test signal to said constant random value for all simulation tests;

performing simulation tests with said simulation test signal;

after said simulation tests are complete, determining, on said computer, a set of signals whose corresponding simulation tests pass a number of times that exceeds a threshold, said determining comprising executing the plurality of simulation tests in the verification/simulation environment associated with said circuit design;

declaring, on said computer, one or more circuit verification checkers corresponding to said set of simulation test signals are suspect for being either missing or defective; and checking, on said computer, whether checkers associated with said suspect signals are missing or defective.

10. The method according to claim 9, wherein said forcing comprises forcing said constant random value on said randomly selected signal for the duration of said simulation tests.

11. The method according to claim 9, wherein determining comprises running only those simulation tests in use in a verification environment associated with said circuit design that are known to pass when random forcing is not employed.

12. The method according to claim 9, wherein determining comprises tracking which signal had its value randomly forced and whether said simulation test passed or failed.

13. The method according to claim 9, wherein determining comprises determining signals that have been forced to constant random values a threshold number of times without any simulation test failing.

14. The method according to claim 9, wherein checking comprises checking whether a suspect signal is examined in a verification program.

15. The method according to claim 9, wherein if the verification program contains a code segment that examines the suspect signal, checking if said code segment is ever called.

16. The method according to claim 15, wherein if said code segment is called, inspecting said code segment to determine whether it contains checks of said suspect signal.

17. The method according to claim 16, wherein if said code segment contains checks of said suspect signal, determining whether said checks cause an error message to be reported when they fail.

18. A computer program product for detecting signals that are not checked in a verification/simulation environment of a circuit design, the computer program product comprising:

a tangible, non-transitory computer usable medium having computer usable code embodied therewith, the computer usable program code comprising:

computer usable code configured for randomly selecting a simulation test signal in a plurality of simulation tests;

computer usable code configured for generating, on said computer, a constant random value;

computer usable code configured for forcing said simulation test signal to said constant random value for all simulation tests;

computer usable code configured for performing simulation tests with said simulation test signal;

computer usable code configured for determining, after said simulation tests are complete, a set of simulation test signals whose corresponding simulation tests pass a number of times that exceeds a threshold, said determining comprising executing the plurality of simulation tests in the verification/simulation environment associated with said circuit design; and computer usable code configured for declaring one or more verification checkers corresponding to said set of simulation test signals are suspect for being either missing or defective.

19. The computer program product according to claim 18, further comprising computer usable code configured for checking whether checkers associated with said set of signals are missing or defective.

20. The computer program product according to claim 18, wherein said forcing comprises forcing a constant random value on said randomly selected signal for the duration of said simulation tests.

21. The computer program product according to claim 18, wherein determining comprises determining signals that have been forced to constant random values a threshold number of times without any simulation test failing.

22. The computer program product according to claim 18, further comprising computer usable code configured for injecting noise into the simulation test signal.

* * * * *